(12) United States Patent
Hsu et al.

(10) Patent No.: US 11,280,556 B2
(45) Date of Patent: Mar. 22, 2022

(54) FAST HEAT-SINKING, CURRENT STABILIZATION AND PRESSURE BOOSTING DEVICE FOR CONDENSER

(71) Applicant: LDC Precision Engineering CO., Ltd., New Taipei (TW)

(72) Inventors: Chi-Feng Hsu, New Taipei (TW); Cheng-Jen Liang, New Taipei (TW); Chih-Wei Chen, New Taipei (TW)

(73) Assignee: LDC PRECISION ENGINEERING CO., LTD., New Taipei (TW)

( * ) Notice: Subject to any disclaimer, the term of this patent is extended or adjusted under 35 U.S.C. 154(b) by 203 days.

(21) Appl. No.: 16/784,047

(22) Filed: Feb. 6, 2020

(65) Prior Publication Data

US 2020/0263933 A1   Aug. 20, 2020

(30) Foreign Application Priority Data

Feb. 20, 2019   (TW) ................. 108105672

(51) Int. Cl.
*F28D 15/02* (2006.01)
*H01L 23/427* (2006.01)
*F28D 15/04* (2006.01)

(52) U.S. Cl.
CPC ........... *F28D 15/025* (2013.01); *F28D 15/04* (2013.01); *H01L 23/427* (2013.01)

(58) Field of Classification Search
CPC ...... F28D 15/025; F28D 15/04; F28D 15/043; F28D 15/046; F28D 2015/0216; F28D 15/02; F28D 15/0266; F28D 2021/0064; F28D 2021/0029; H01L 23/427; H05K 7/20309; F28F 3/08; F28F 3/12

USPC ................. 165/104.26, 104.21; 361/700
See application file for complete search history.

(56) References Cited

U.S. PATENT DOCUMENTS

| | | | | |
|---|---|---|---|---|
| 7,516,777 B2 * | 4/2009 | Terakado | ............... | F28F 13/06 165/80.4 |
| 7,836,597 B2 * | 11/2010 | Datta | .................. | F28D 15/0266 29/890.041 |
| 10,443,960 B2 * | 10/2019 | Wan | ........................ | F28F 13/08 |
| 10,845,124 B2 * | 11/2020 | Sugimura | ............. | F28D 1/0443 |
| 2004/0075181 A1 * | 4/2004 | Hara | .................... | F28D 15/0233 261/99 |
| 2008/0164010 A1 * | 7/2008 | Kang | ................... | F28D 15/046 165/104.26 |
| 2009/0283247 A1 * | 11/2009 | Aung | ..................... | F25B 41/37 165/178 |
| 2012/0210746 A1 * | 8/2012 | Kadle | .................. | F28D 9/0093 62/498 |

(Continued)

*Primary Examiner* — Justin M Jonaitis
(74) *Attorney, Agent, or Firm* — Chun-Ming Shih; Lanway IPR Services

(57) ABSTRACT

A fast heat-sinking, current stabilization and pressure boosting device for condenser is disclosed, comprising a heat exchange module and an outer case. The heat exchange module is further divided into a high pressure area and a low pressure area, and an air in channel is installed in the high pressure area and a water out channel is installed in the low pressure area; also, the heat exchange module is provided with at least one channel, and the heat exchange module is assembled inside the outer case. As such, the pressure difference between the low pressure area and the high pressure area can drive the water in each of the inner channels to flow faster toward the low pressure area.

10 Claims, 22 Drawing Sheets

(56) References Cited

U.S. PATENT DOCUMENTS

2015/0053378 A1\* 2/2015 Numata ................ F25B 39/028
                                                                                                                     165/157
2020/0254845 A1\* 8/2020 Miura ................ B60H 1/32281

\* cited by examiner

FAST HEAT-SINKING, CURRENT STABILIZATION AND PRESSURE BOOSTING DEVICE FOR CONDENSER

BACKGROUND OF THE INVENTION

1. Field of the Invention

The present invention generally relates to a fast heat-sinking, current stabilization and pressure boosting device for condenser; in particular, it relates to a heat-sinking structure which is capable of internally performing gas-to-liquid conversions on liquid water heated into gaseous phase in order to achieve the heat dissipation function, and is suitable for various electronic components to achieve the heat dissipation purpose in combination with evaporators.

2. Description of Related Art

In recent years, the heat generation of electronic components has been increasing rapidly with the precision improvements of semiconductor processes. Therefore, how to enhance the heat-sinking capability of electronic components in order to maintain the normal operations of components has become a very important engineering issue. Direct air cooling technology, which has been comprehensively utilized in various fields at present, is no longer appropriate for fulfilling heat dissipation requirements of many electronic components featuring high heat flux, indicating that other solutions need to be sought.

Among the existing technologies, in addition to the aforementioned air-cooling technology, there is also another type of technology which applies liquid-to-gas conversion of water to achieve the heat dissipation effect. This technology provides two sets of heat spreaders and two sets of connected pipes, in which one set of heat spreaders is used to evaporate in order to remove the absorbed heat, while the other set of heat spreaders used to condense (i.e., the condenser) so as to cool down to bring back the output cooling water for subsequent heat dissipation loops. It should be noticed that the pressures in such two sets of heat spreaders are different, so the water can be automatically transported back and forth during operations to for a circulation loop. But most of the aforementioned heat spreaders are simply fins or flow channels designed to allow liquid to internally circulate through them, which may easily cause the heat source to be concentrated at a specific location, so excessive evaporation may occur, adversely leading to exceedingly low water levels and overly high temperature, thus resulting in instable and uneven heat dissipation effects and fast reduced lifespan.

In addition, since there will be a large amount of water circulating inside the heat spreaders, in case the water circulation path is not restricted, the internal water is prone to leakage problems, and the pressure cannot be properly maintained therein, thus probably disturbing the internal water circulation condition and adversely affecting the usage efficiency thereof.

Therefore, it is desirable to design a type of heat exchange module in order to improve the inner channels and increase the internal high and low pressure difference to improve the efficiency of the internal water circulation; in addition, it is also necessary to block the water within the heat exchange module to directly contact the outer case thereby eliminating leakage issues, and to quickly elevate the internal pressure so that the water can be discharged stably and quickly, which indicates that the stability of the water flow can be effectively enhanced by means of pressure boosting; as such, the solution of fast heat-sinking, current stabilization and pressure boosting device for condenser according to the present invention is herein provided.

SUMMARY OF THE INVENTION

A fast heat-sinking, current stabilization and pressure boosting device for condenser according to the present invention is disclosed, comprising a heat exchange module and an outer case, wherein the heat exchange module is assembled by stacking a large number of heat exchange components continuously, with each of the heat exchange components forming a large number of inner channels arranged in parallel with each other, in which the heat exchange module is further divided into a high pressure area and a low pressure area, and the inner channels distributed in the high pressure area have a higher internal temperature, while the inner channels distributed in the low pressure area have a lower internal temperature; also, a cold wind source is provided beside the low pressure area, an air inlet is openly installed in the high pressure area, and the air in channel passes through each of the inner channels located in the high pressure area, and a water out channel is openly installed in the low pressure area, while the water out channel runs through each of the inner channels located in the low pressure area; in addition, the heat exchange module is configured with at least one channel, such that the each of the channels allows each of the inner channels between the high pressure area and the low pressure area to mutually communicate; in addition, the outer case is internally configured with a chamber for placing the heat exchange module, and includes an outer lid for covering in fit the chamber, and is installed with an air inlet and a water outlet respectively, in which the air inlet is located correspondingly to the position of the air in channel, and the water outlet is located correspondingly to the position of the water out channel; by means of such, the cold wind source significantly lowers the temperature of the low pressure area in order to intensify the internal pressure difference between the low pressure area and the high pressure area, so that the gaseous water in the high pressure area can be more significantly affected by the pressure difference to flow faster toward the low pressure area thereby improving use efficiency.

In a preferred embodiment, the cold wind source can provide naturally or unnaturally formed cold wind.

In a preferred embodiment, the cold wind source can be replaced with a cold wind generator which is mounted beside the low pressure area, and then directly blows the generated cold wind toward the low pressure area.

In a preferred embodiment, the low pressure area is located beside the cold wind source, and a cold wind generator is installed beside the high pressure area such that the cold wind generator draws the cold wind generated by the cold wind source to the low pressure area by means of suction operations.

In a preferred embodiment, a predetermined space is configured between the at least one end of each of the heat exchange components and the inner lateral surface of the chamber, and an impedance block is installed within the predetermined space so that the liquid water or gaseous water in each of the inner channels can not directly contact the chamber and the outer lid from the two ends of each of the inner channels, thereby further eliminating overflow and leakage issues at the joint.

In a preferred embodiment, the impedance block is installed on one side of the outer lid opposite to the chamber.

In a preferred embodiment, each of the heat exchange components is composed of a first board surface, a second board surface and a third board surface integrally formed or fixed to each other, so that the heat exchange components internally form a semi-open type in the inner channel; in addition, a fourth board surface is respectively installed on each of the heat exchange components with respect to the two ends of the inner channel, and since the fourth board surface is provided at the two ends of each of the inner channels for blocking, the liquid water or gaseous water in each inner channel can not directly contact the chamber and the outer lid from the two ends of each inner channel, thereby further eliminating overflow and leakage issues at the joint; in addition, a large amount of liquid water or gaseous water is retained in each of the inner channels, the gaseous water can be stably cooled and condensed into liquid water, in particular blocked at the two ends of each of the inner channels, so as to rapidly elevate the internal pressure to form a high pressure which can be used to force the liquid water to be discharged via the water out channel, thus stabilizing the internal water flow by means of pressure boosting.

In a preferred embodiment, the fourth board surface is formed by the two ends of the first board surface extending toward the inner channel, and the extension length of the fourth board surface is the same as that of the second board surface and the third board surface, such that the fourth board surface is completely blocked at the two ends of each of the inner channels.

In a preferred embodiment, the fourth board surface is formed by the two ends of the first board surface extending toward the middle or the upside of the inner channel, and the extension length of the fourth board surface is the same as that of the second board surface and the third board surface, such that the fourth board surface is completely blocked at the middle or the upside of the two ends of each of the inner channels.

In a preferred embodiment, the fourth board surface is formed by the two ends of the first board surface extending toward the inner channel, and the extension length of the fourth board surface is shorter than that of the second board surface and the third board surface, such that the fourth board surface is not completely blocked at the two ends of each of the inner channels.

In a preferred embodiment, a slot is respectively configured at the upside of the two ends of the first board surface, and the fourth board surface is inserted into the slot.

In a preferred embodiment, the air in channel and the water out channel are provided close to one end of the inner channel, and each of the channels is provided at the upside and downside of the heat exchange module far from the positions of the air in channel and the water out channel.

In a preferred embodiment, the air in channel is located at the middle of the downside of the high pressure area, the water out channel is located at the middle of the downside of the low pressure area opposite to the air in channel, and the channel is located at the two ends of the heat exchange module remote from the air in channel and the water out channel, such that each of the channels allows each of the inner channels between the high pressure area and the low pressure area to mutually communicate.

DETAILED DESCRIPTION OF THE PREFERRED EMBODIMENTS

Figure 1:
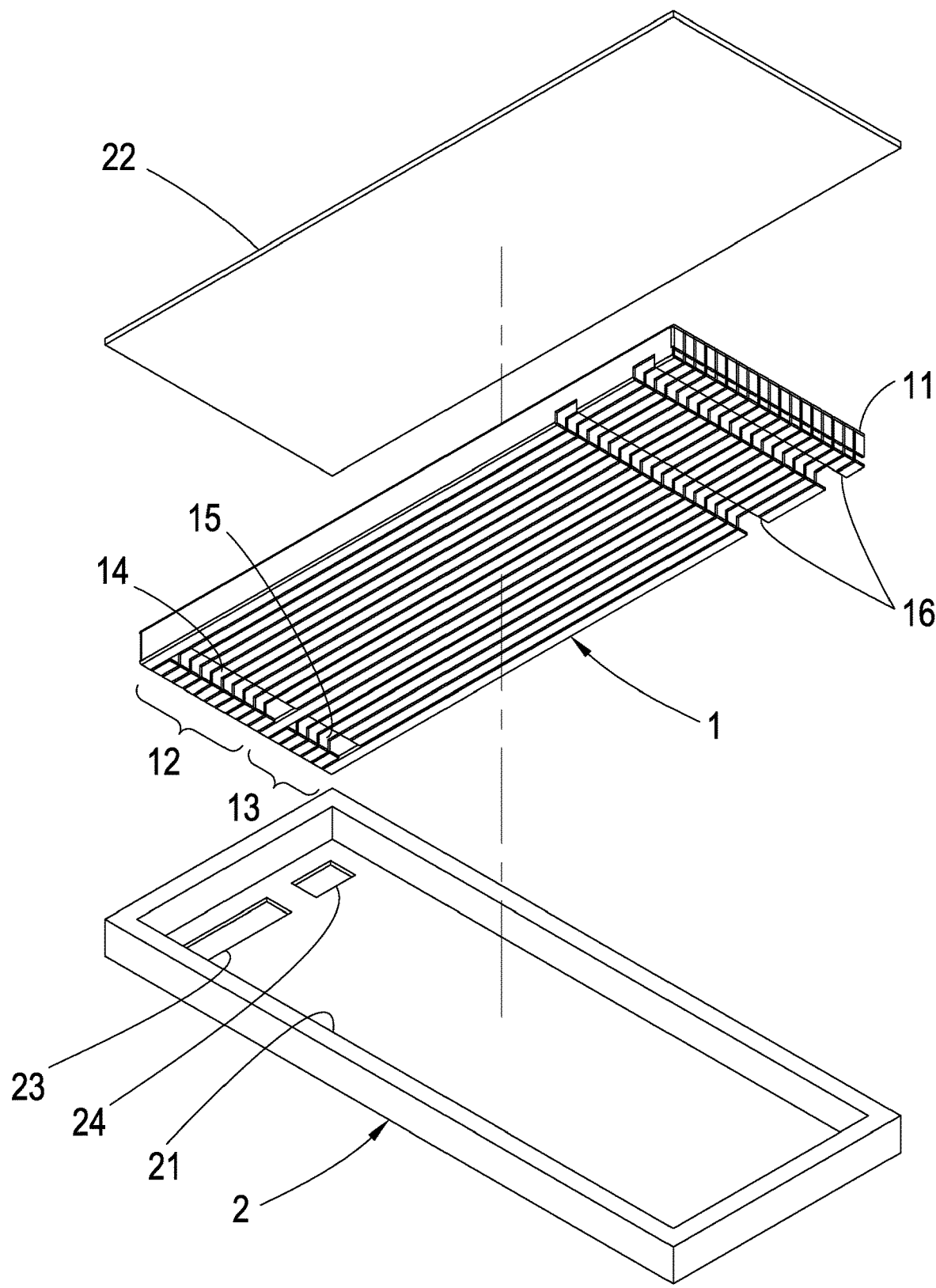
FIG. 1 shows a stereo disassembly view for a first embodiment of the condenser according to the present invention.
Figure 2:
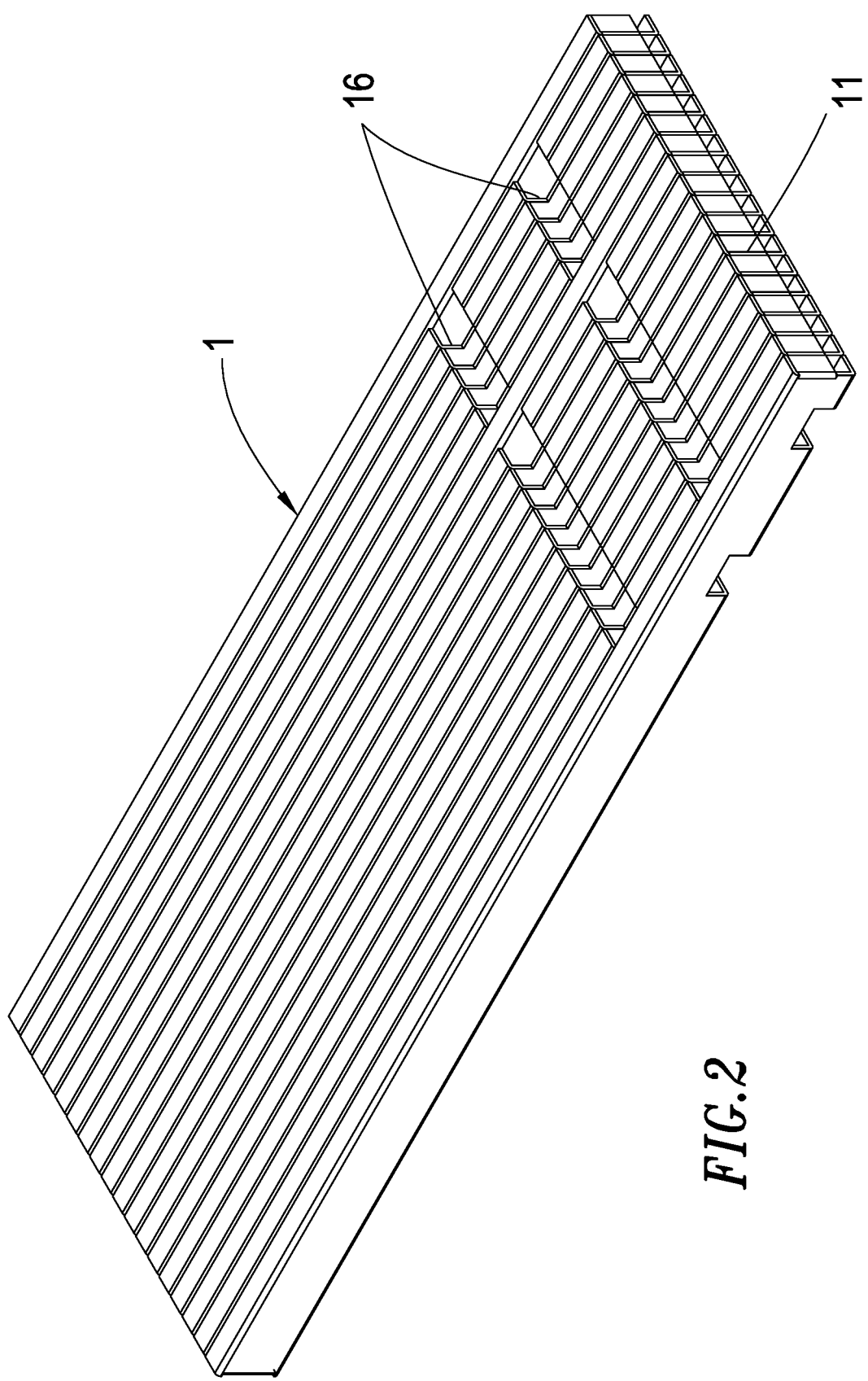
FIG. 2 shows a stereo view for the first embodiment of the heat exchange module in the condenser according to the present invention.
Figure 3:
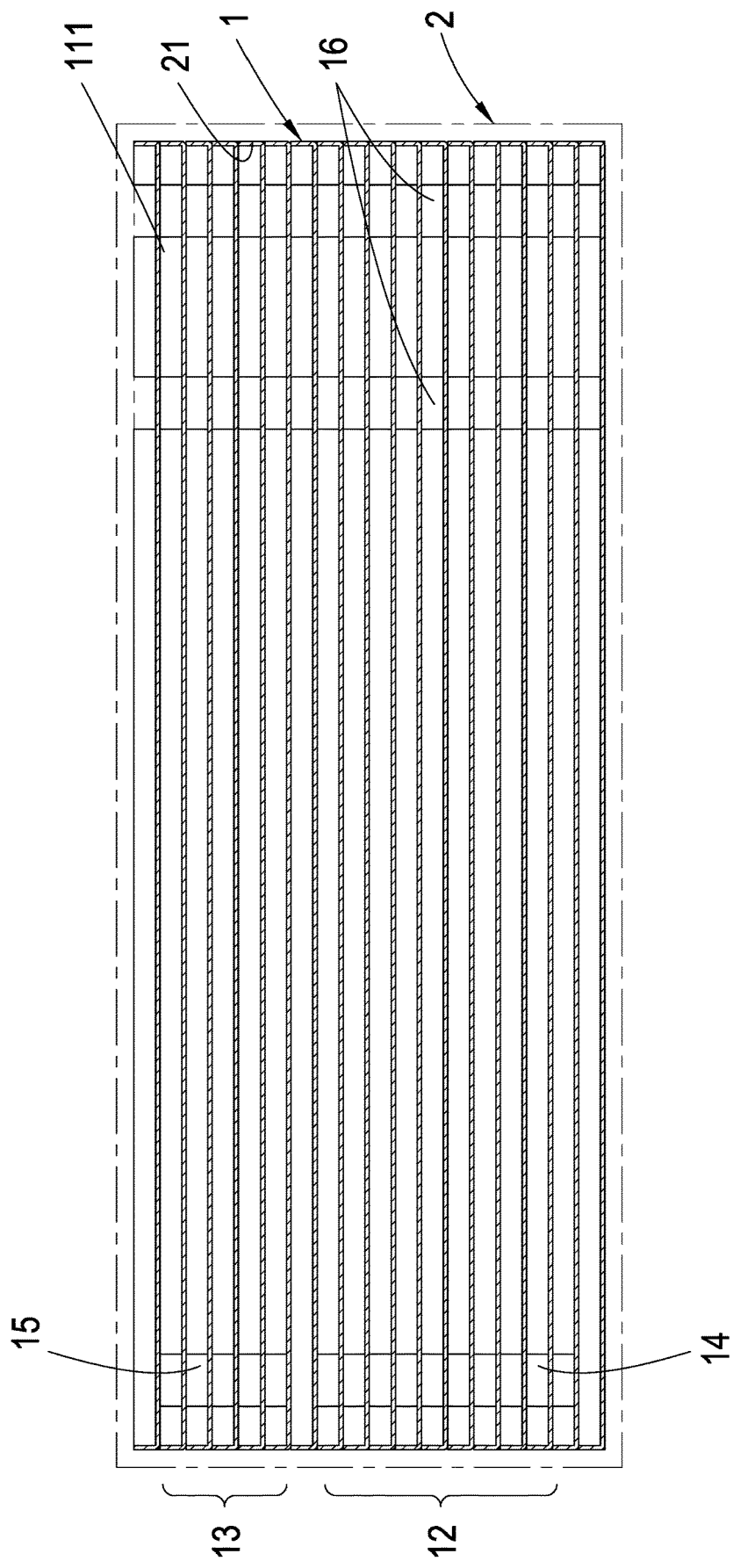
FIG. 3 shows a cross-sectioned view for the first embodiment of the heat exchange module in the condenser according to the present invention.
Figure 4:
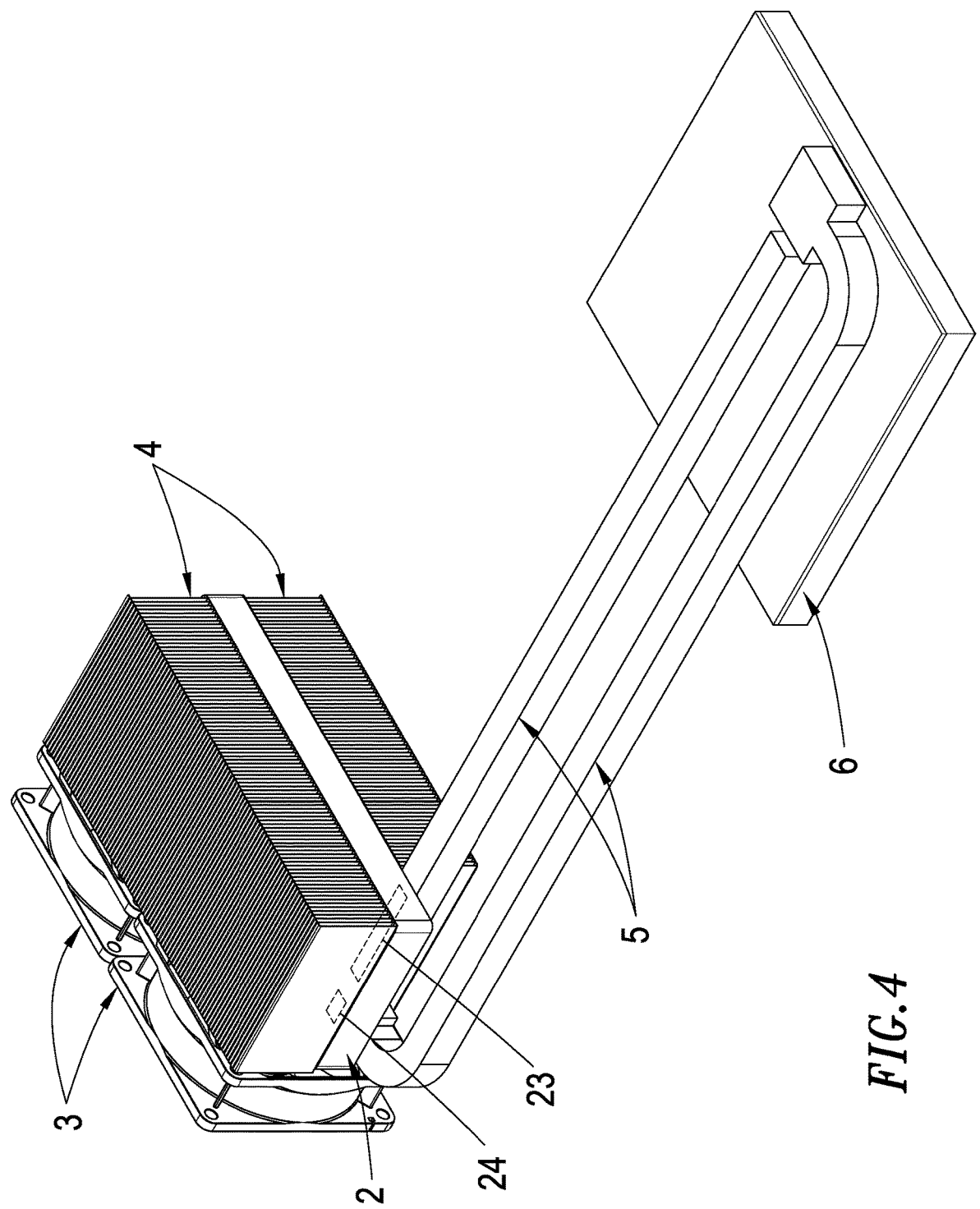
FIG. 4 shows an integral view of the condenser according to the present invention in combination with an evaporator.
Figure 5:
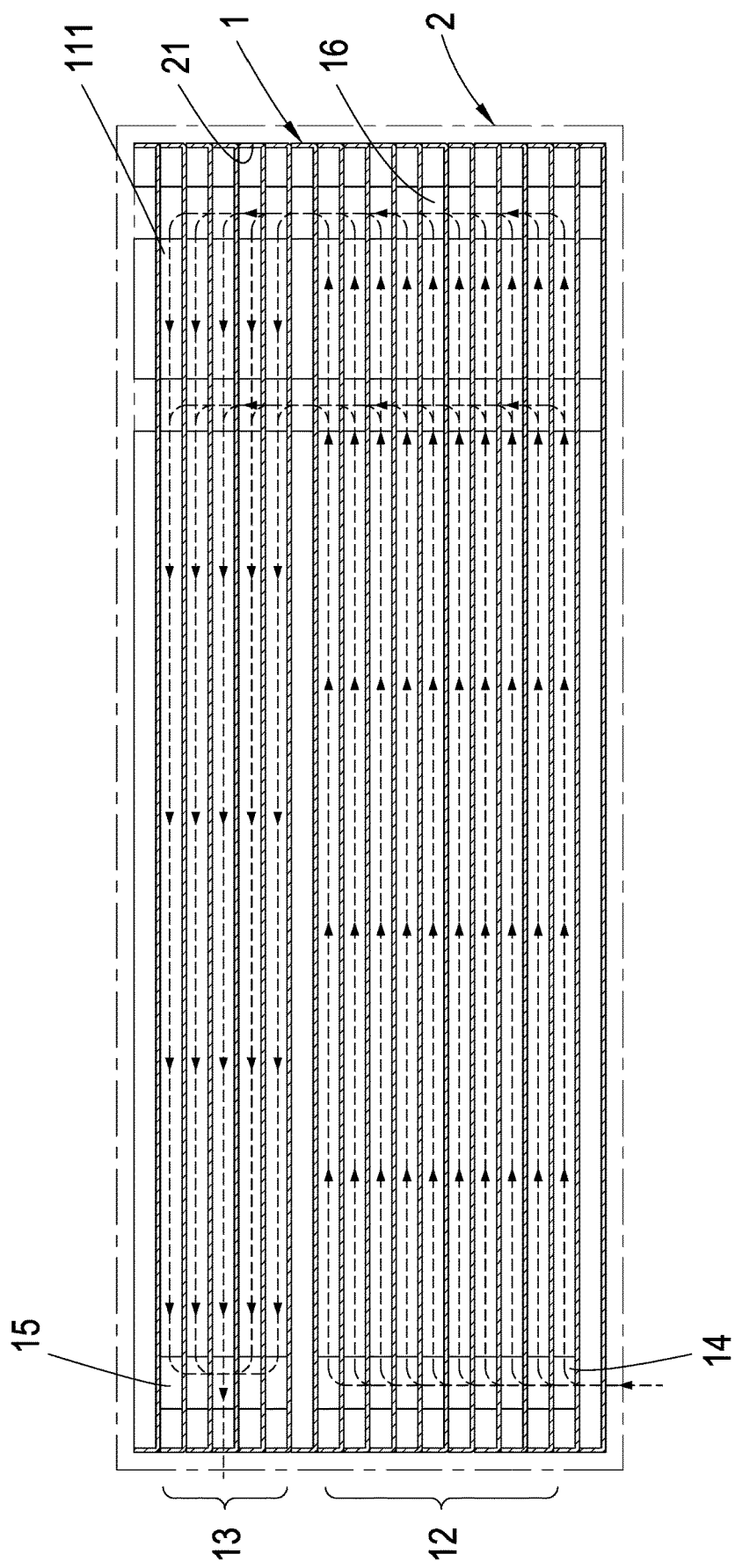
FIG. 5 shows an operational cross-sectioned view for the first embodiment of the condenser according to the present invention.
Figure 6:
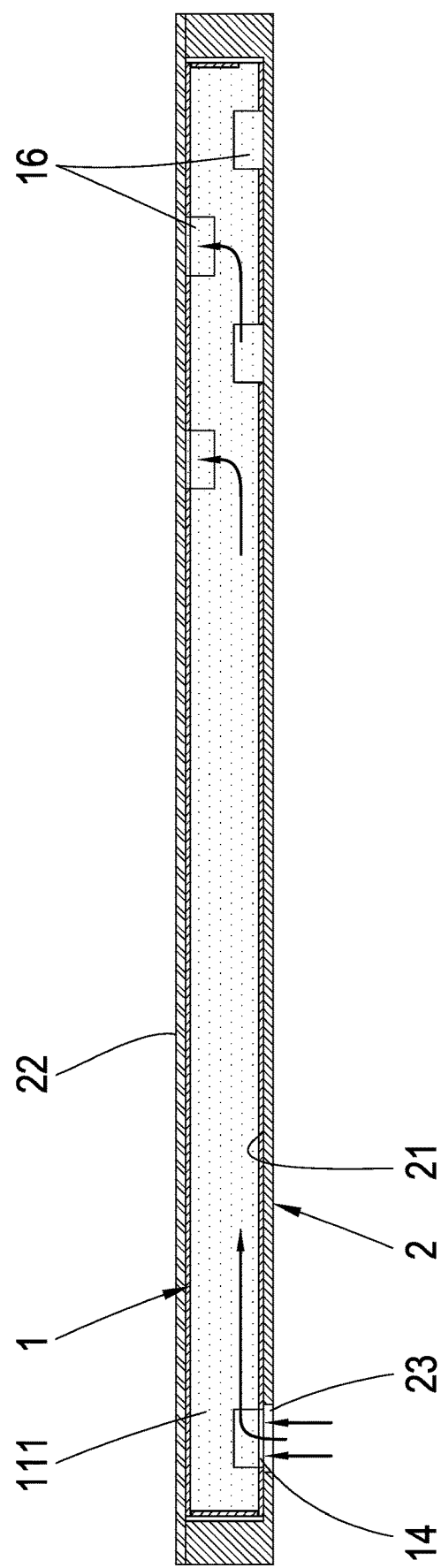
FIG. 6 shows an operational cross-sectioned view for the first embodiment of the condenser according to the present invention.
Figure 7:
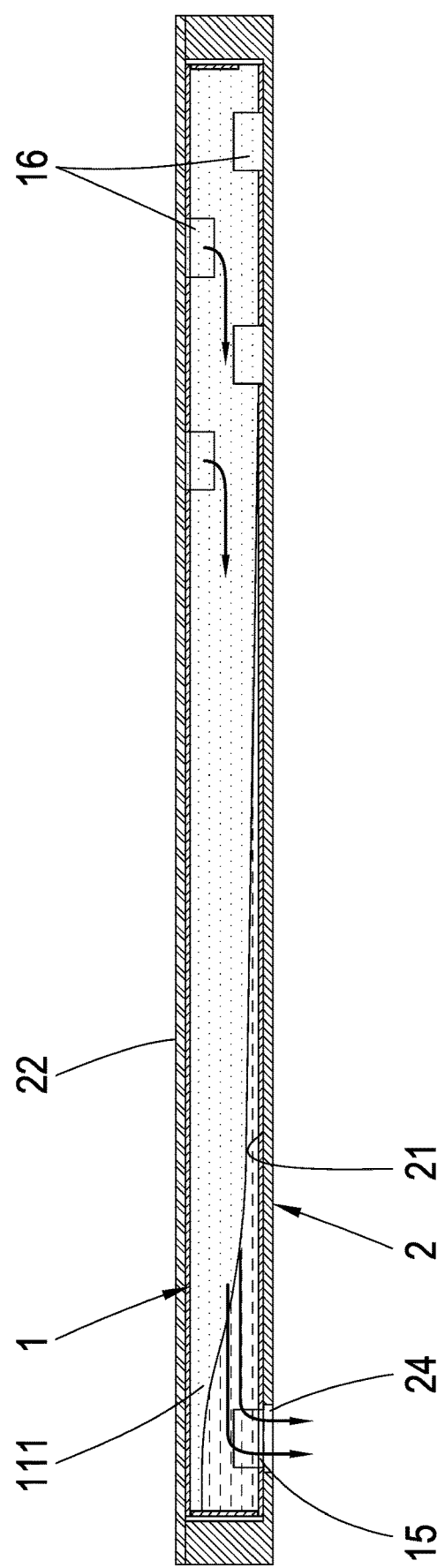
FIG. 7 shows an operational cross-sectioned view for the first embodiment of the condenser according to the present invention.

Other technical contents, aspects and effects in relation to the present invention can be clearly appreciated through the detailed descriptions concerning the preferred embodiments of the present invention in conjunction with the appended drawings.

Refer first to FIGS. 1~4, wherein stereo views and internally structural cross-sectioned views of a fast heat-sinking, current stabilization and pressure boosting device for condenser according to the present invention are respectively shown. As shown in these Figures, the first embodiment regarding to the integral configuration of the fast heat-sinking, current stabilization and pressure boosting device for condenser according to the present invention is characterized in a sort of "side-in-side-out" form and comprises a heat-sinking module 1 and an outer case 2.

Herein the heat exchange module 1 is assembled by continuously stacking a large number of heat exchange components 11, with each of the heat exchange components 11 internally including a large number of inner channels 111 mutually arranged in parallel, and the heat exchange module 1 is also divided into two parts, i.e., a high pressure area 12 and a low pressure area 13 (therefore, a part of each of the inner channels 111 is located in the high pressure area 12 while another part of each of the inner channels 111 located in the low pressure area 13). The internal temperature of the inner channels 111 distributed in the high pressure area 12 is comparatively higher, and the internal temperature of the internal channel 111 distributed in the low pressure area 13 is lower. In addition, a cold air source 3 is provided beside the low pressure area 13, which can generate cold wind for cooling to the low pressure area 13. An air in channel 14 is openly configured below the high pressure area 12 and penetrates through each of the inner channels 111 located in the high pressure area 12. A water out channel 15 is opened below the low pressure area 13, and the water out channel 15 passes through each of the inner channels 111 located in the low pressure area 13; also, the air in channel 14 and the water out channel 15 are located close to one end of the inner channel 111. The heat exchange module 1 is openly configured respectively with at least one channel 16 at the upside and downside remote from the positions of the air in channel 14 and the water out channel 15, so that each of the channels 16 allows each of the inner channels 111 between the high pressure area 12 and the low pressure area 13 to communicate with each other.

Meanwhile, the outer case 2 is internally configured with a chamber 21 for placing the heat-sinking module 1, with the two sides of the heat-sinking components 11 being closely attached to the inside of the chamber 21, and the outer case 2 also includes an outer lid 11 for covering in fit the chamber 21; in addition, the outer case 2 is further respectively configured with an air inlet 23 and a water outlet 24, in which the air inlet 23 corresponds to the position of the air in channel 14, and the water outlet 24 corresponds to the position of the water out channel 15.

Next, refer to FIGS. 4~7, wherein the outer case 2 is installed with heat-sinking fins 4 as well as at least two connection tubes 5, in which one of the connection tubes 5 is connected to the air inlet 23, while the other one is connected to the water outlet 24; and the connection tube 5 is further connected to an evaporator 6:

During the heat exchange operation, the evaporator 6 is assembled onto a heating end (e.g., an electronic component), and, upon heating, the heat generated by the heating end passes through the evaporator 6 to evaporate the internal liquid water into gaseous water, and the generated gaseous water goes into the air inlet 14 via one of the connection tubes 5 and then travels into each of the inner channels 111.

After entering each of the inner channels 111, the gaseous water will automatically pass through each of the channels 16 to the water out channel 15 having lower pressure; during the process of the gaseous water going to the water out channel 15, a part of the thermal energy can be radiated by means of the heat-sinking fins 4 thereby quickly taking away thermal energy. Besides, since the cold wind source 3 externally provides cold air into the low pressure area 13, it can help to dissipate heat thus allowing gaseous water to cool down and condense into liquid water which then flows from the inner channel 111 to the water out channel 15 and, via the water outlet 24, returns back to the evaporator 6 by way of another connection tube 5, such that the liquid water can be once again heated and evaporated into gaseous water so as to continuously circulate to achieve the purposes of repeated circulation and heat dissipation. Moreover, the cold wind source 3 can also significantly increase the temperature difference between the low pressure area 13 and the high pressure area 12 in order to aggravate the pressure difference between the insides of the low pressure area 13 and the high pressure area 12, thus further driving the gaseous water in the high pressure area 12 to flow faster into the low pressure area 13 due to the greater pressure difference.

Figure 8:
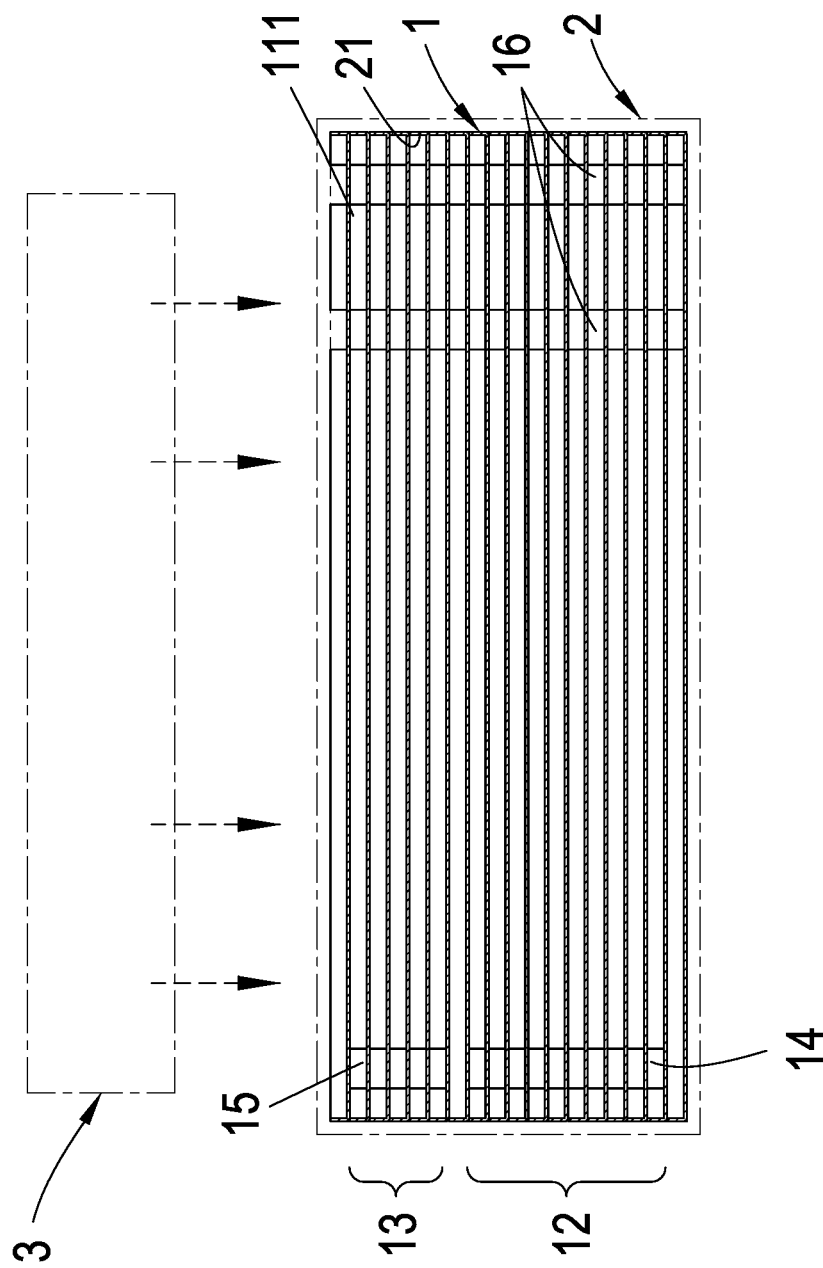
FIG. 8 shows a configuration cross-sectioned view for the first embodiment of the condenser according to the present invention.

Next, refer to FIG. 8, wherein a first embodiment of the cold wind source 3 is shown, which can provide naturally or unnaturally formed cold wind (for example, a natural convection vent or else an air exhaust outlet of a predetermined device).

Figure 9:
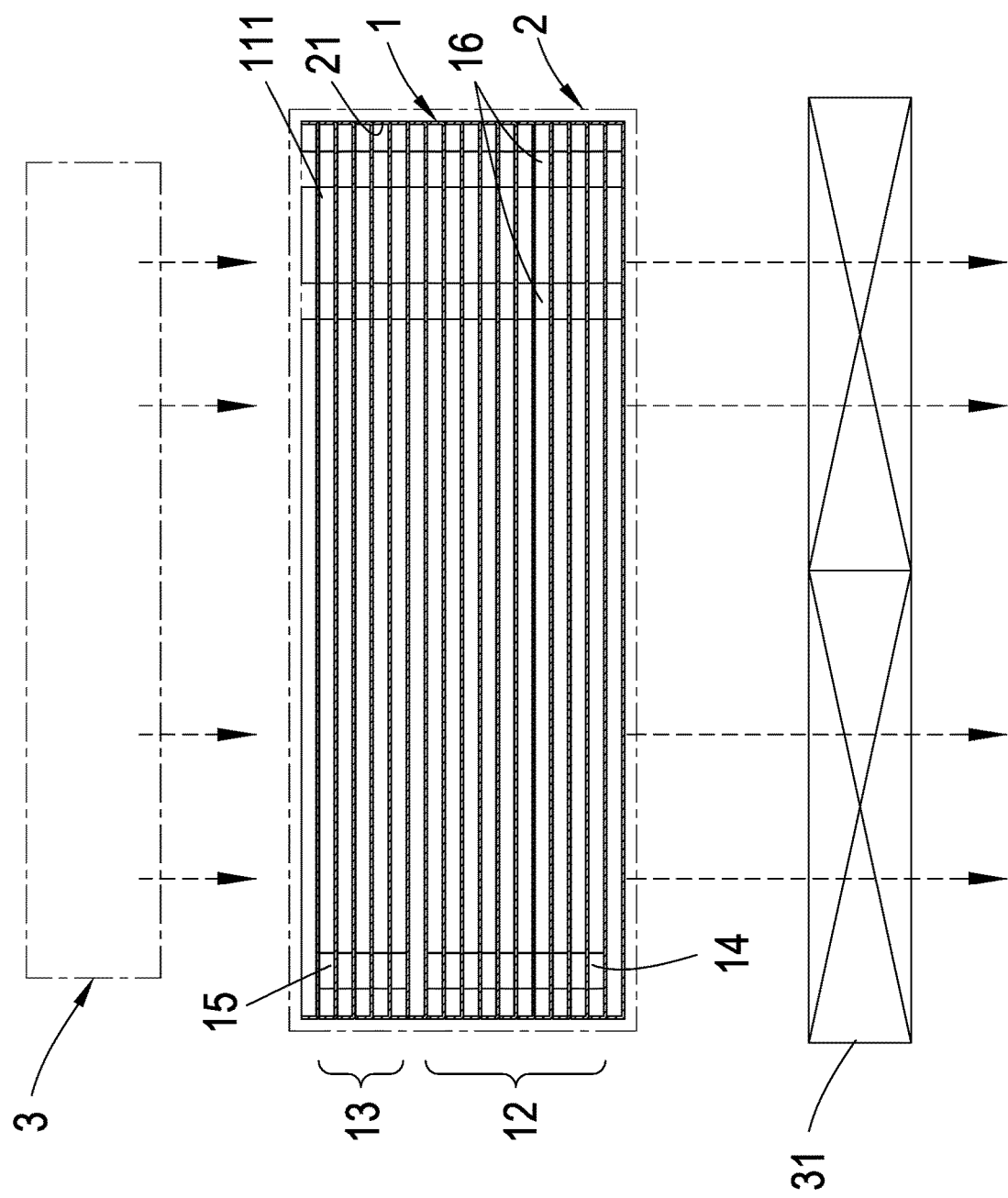
FIG. 9 shows a configuration cross-sectioned view for a second embodiment of the condenser according to the present invention.

Refer to FIG. 9, wherein a second embodiment of the cold wind source 3 is shown, which can be a cold wind generator 31 for replacement and mounted beside the low pressure area 13 thus directly blowing the generated cold wind toward the low pressure area 13.

Figure 10:
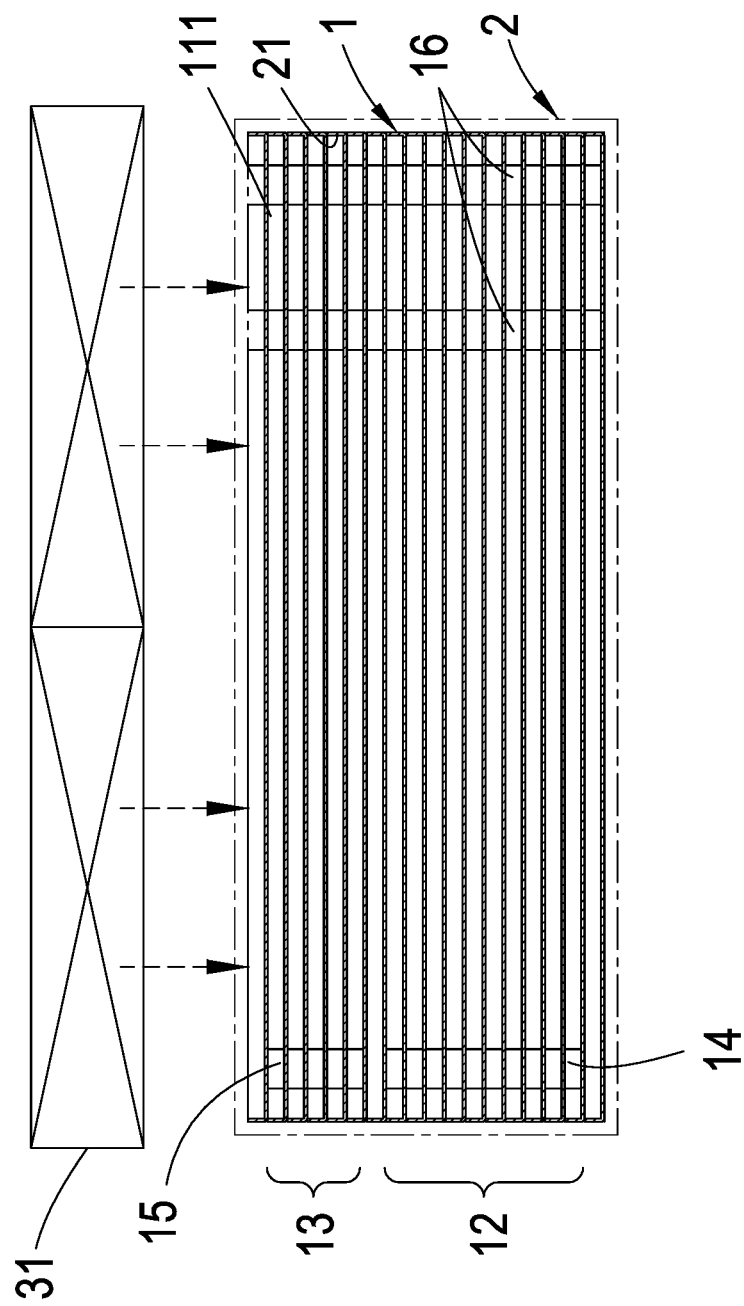
FIG. 10 shows a configuration cross-sectioned view for a third embodiment of the condenser according to the present invention.

In addition, refer to FIG. 10, wherein a third embodiment of the cold wind source 3 is shown in, and the low pressure area 13 is located beside the cold wind source 3, and the cold wind generator 31 is installed beside the high pressure area 12; hence, the cold wind generated by the cold wind source 3 can be drawn to the low pressure area 13 in a suction manner by means of the cold wind generator 31, and the cold wind generator 31 may be a fan.

Subsequently, refer to FIGS. 11 and 12, wherein the second embodiment of the overall structure configuration of the present invention are respectively shown, and this embodiment exhibits a middle-in-side-out fashion; in this embodiment, the air in channel 14 is located at the middle of the downside of the high pressure area 12, the water out channel 15 is located at the middle of the downside of the low pressure area 13 opposite to the air in channel 14, and the channel 16 is located at the two ends of the heat exchange module 1 remote from the air in channel 14 and the water out channel 15, such that each of the channels 16 allows each of the inner channels 111 between the high pressure area 12 and the low pressure area 13 to mutually communicate.

Figure 13A:
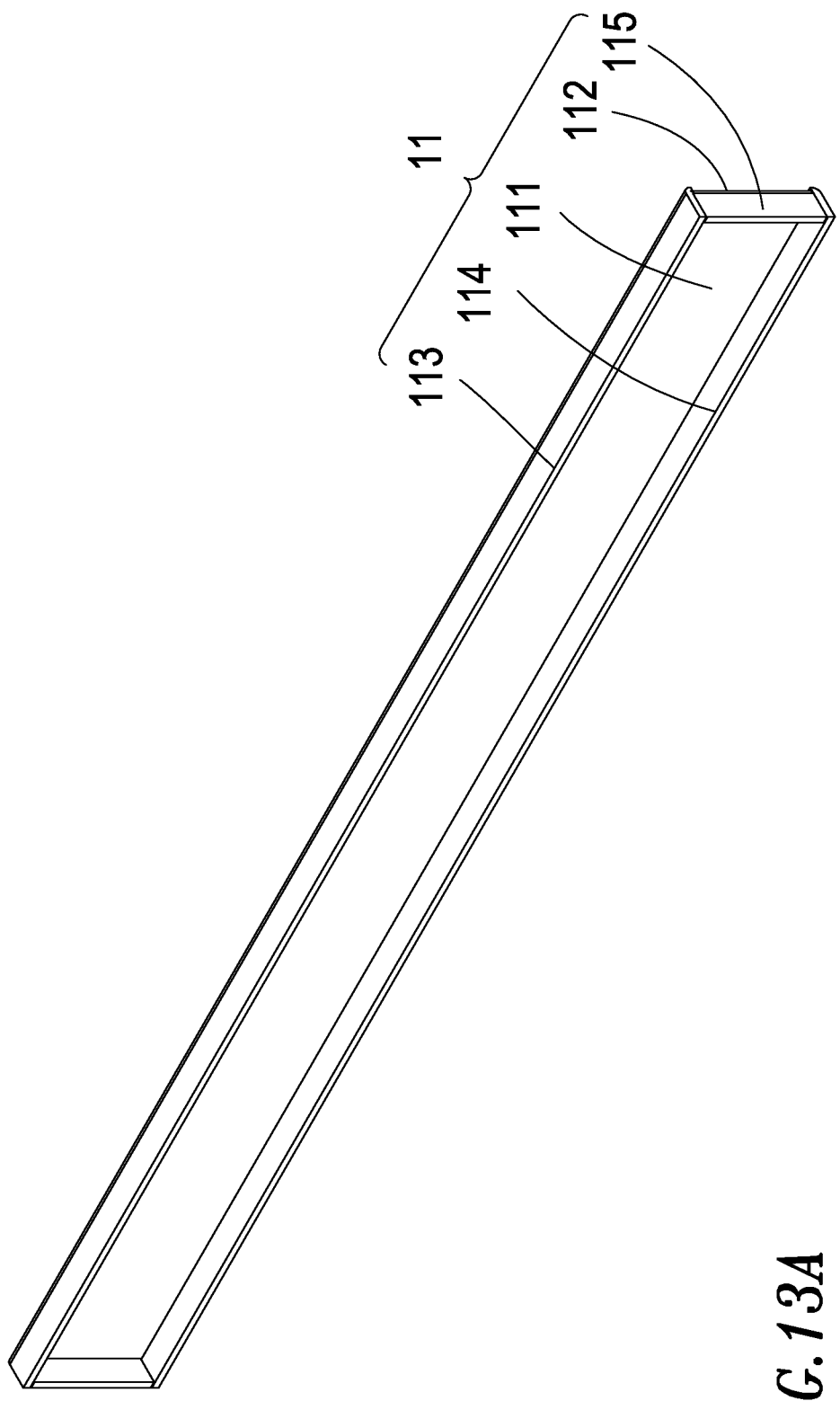
FIG. 13A shows a configuration stereo view for a first embodiment of the heat exchange component in the condenser according to the present invention.
Figure 14:
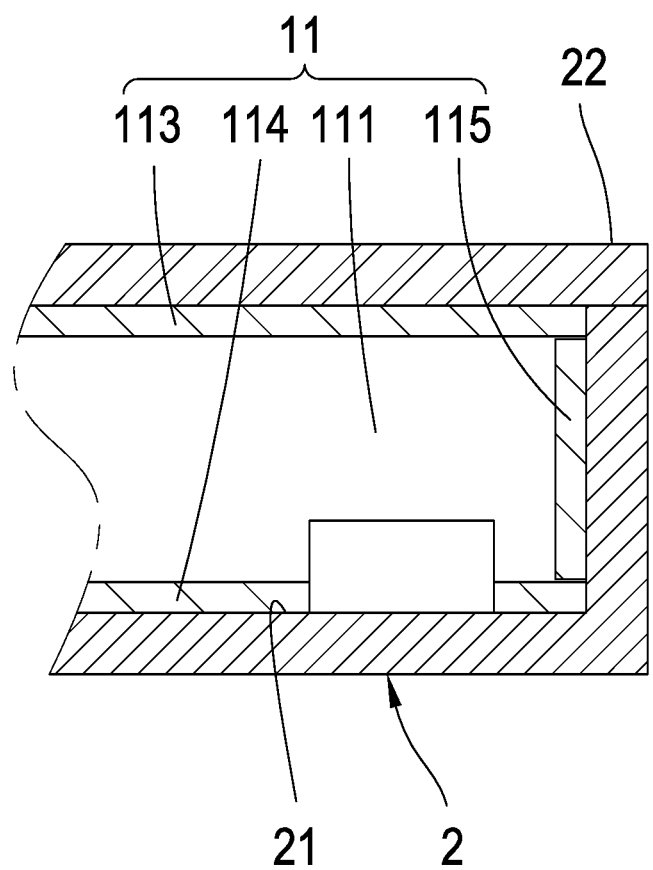
FIG. 14 shows a partial configuration cross-sectioned view for the first embodiment of the heat exchange component in the condenser according to the present invention.

Refer now to FIGS. 13A and 14 for the fast heat-sinking, current stabilization and pressure boosting device for condenser according to the present invention, wherein each of the heat exchange components 11 is composed of a first board surface 112, a second board surface 113 and a third board surface 114 integrally formed or fixedly attached to each other, so that the inside of the heat exchange component 11 can provide a semi-opened inner channel 111. In addition, a fourth board surface 115 is provided at the two ends of the heat exchange component 11 opposite to the inner channel 111, and since the fourth board surface 115 is provided at the two ends of each of the inner channels 111 for blocking, it is possible to prevent liquid water or gaseous water in each of the inner channels 111 from directly contacting the chamber 21 and the outer lid 22 via the two ends of each of the inner channels 111, thus eliminating the overflow or leakage issues at the joints. Meanwhile, a large amount of liquid water or gaseous water is retained in each of the inner channels 111, and the gaseous water is stably cooled down and condensed to liquid water, especially blocked at the two ends of each of the inner channels 111, to rapidly increase the internal pressure in order to create a high pressure therein which then quickly forces the liquid water to be discharged from the water out channel 15 such that the internal water flow can be stabilized.

Figure 13B:
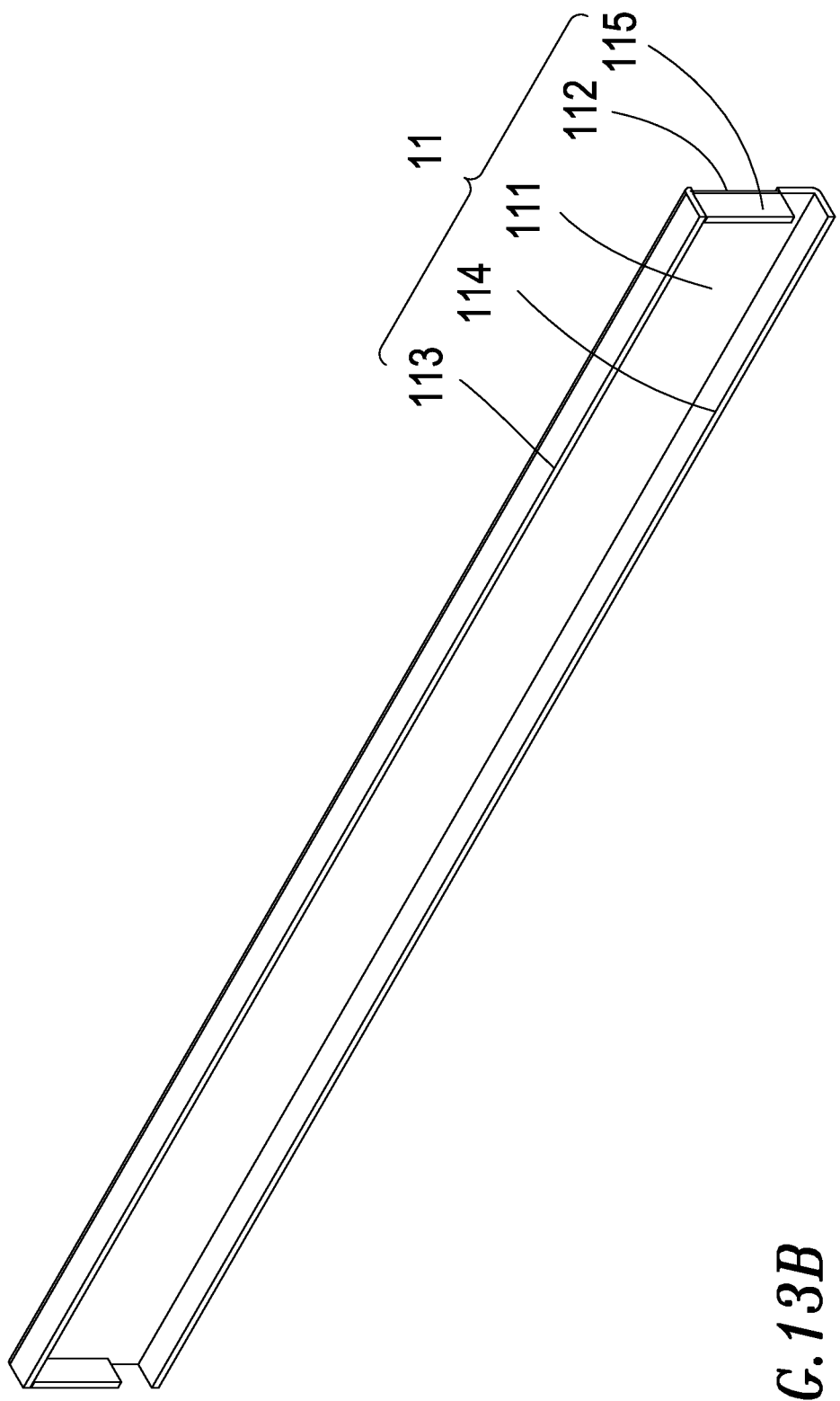
FIG. 13B shows a configuration stereo view for a second embodiment of the heat exchange component in the condenser according to the present invention.
Figure 13C:
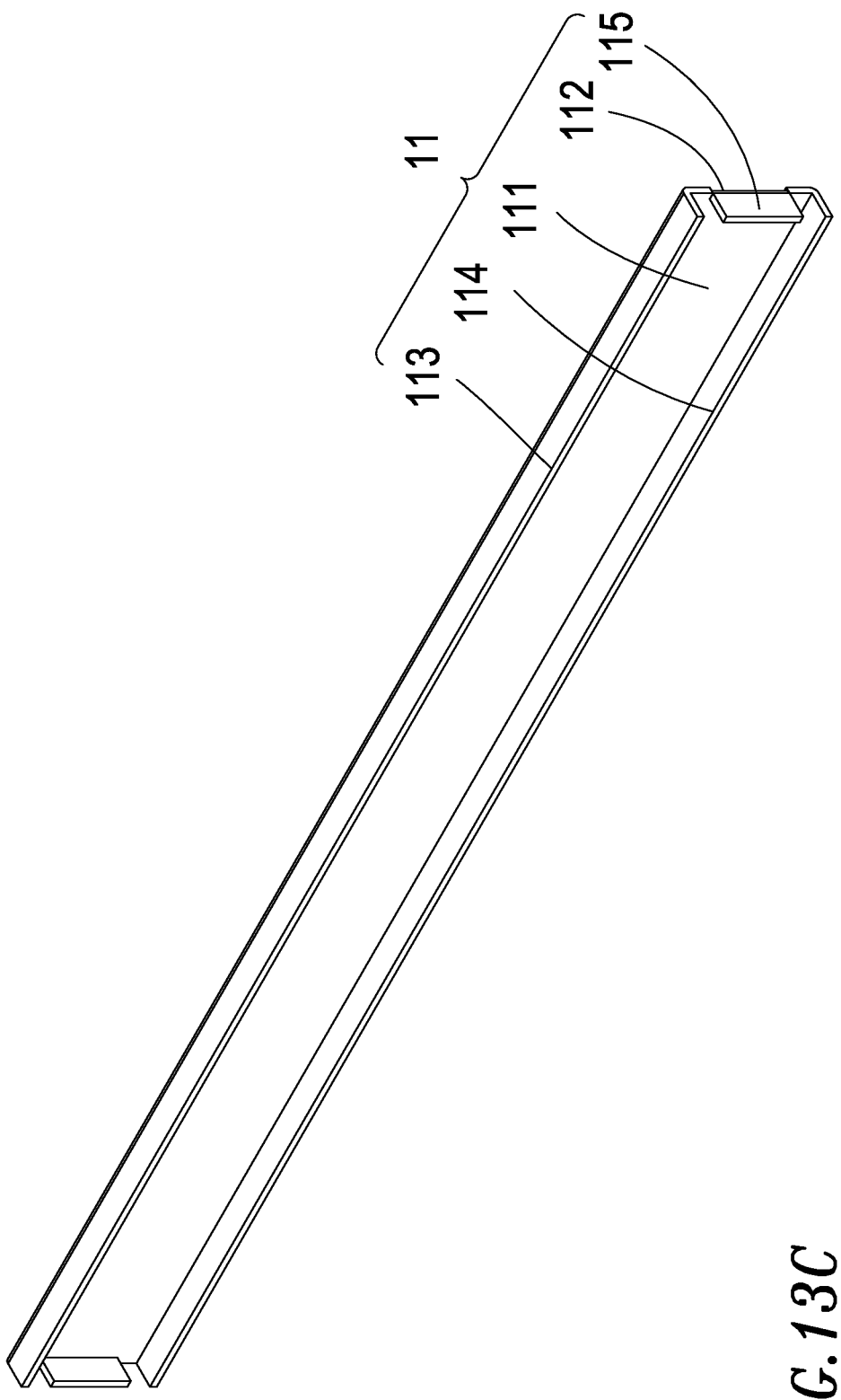
FIG. 13C shows a configuration stereo view for a third embodiment of the heat exchange component in the condenser according to the present invention.
Figure 13D:
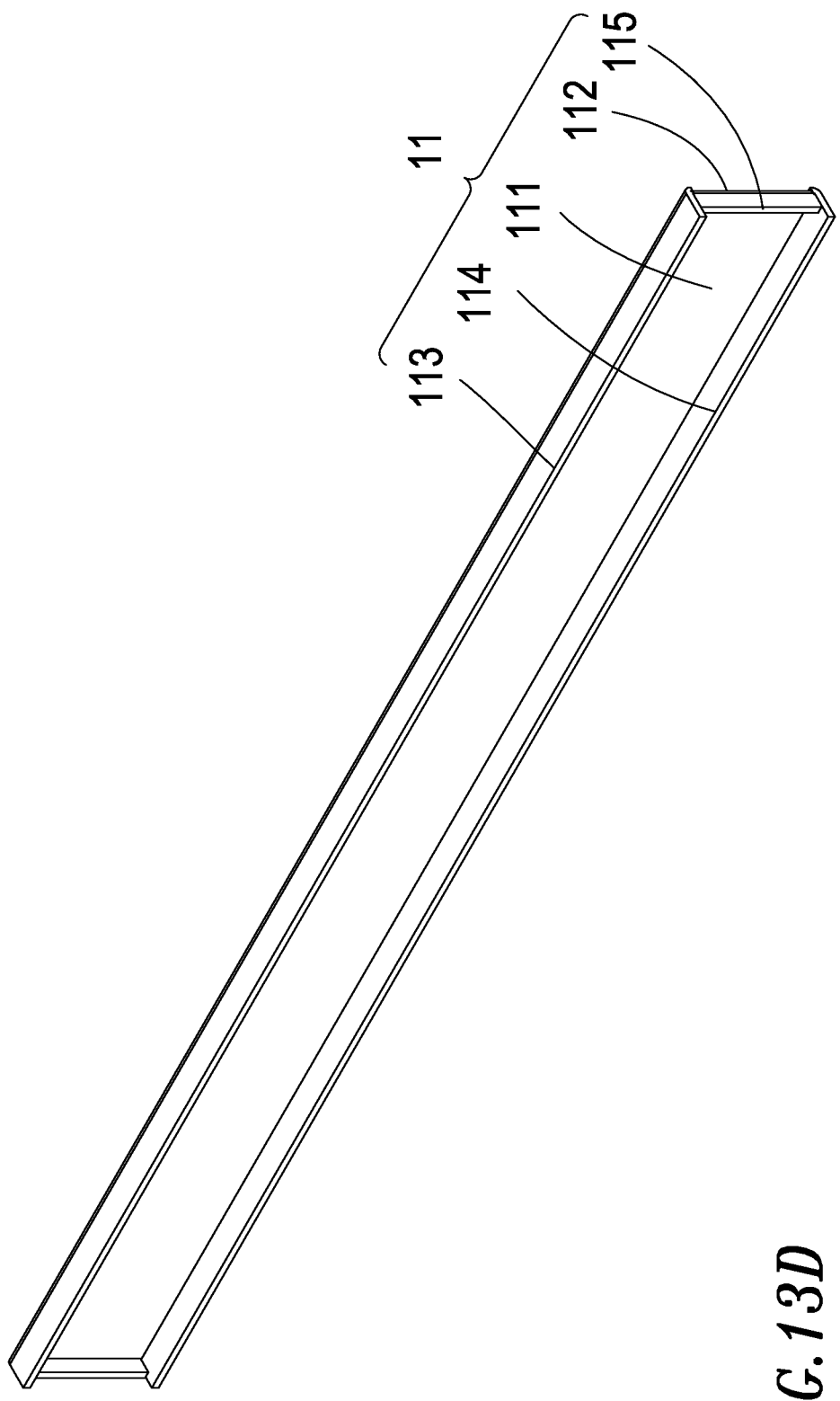
FIG. 13D shows a configuration stereo view for a fourth embodiment of the heat exchange component in the condenser according to the present invention.
Figure 13E:
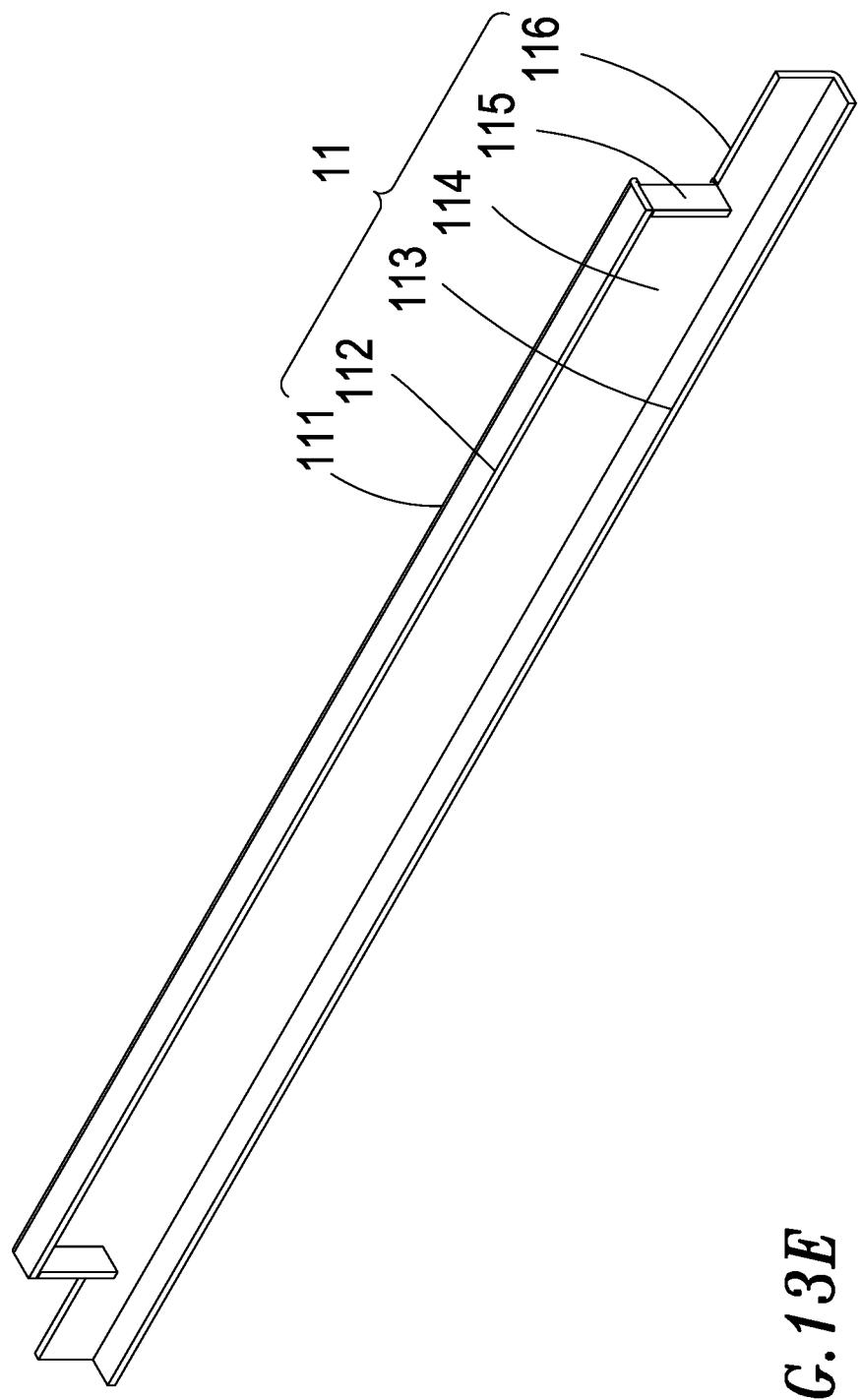
FIG. 13E shows a configuration stereo view for a fifth embodiment of the heat exchange component in the condenser according to the present invention.
Figure 13F:
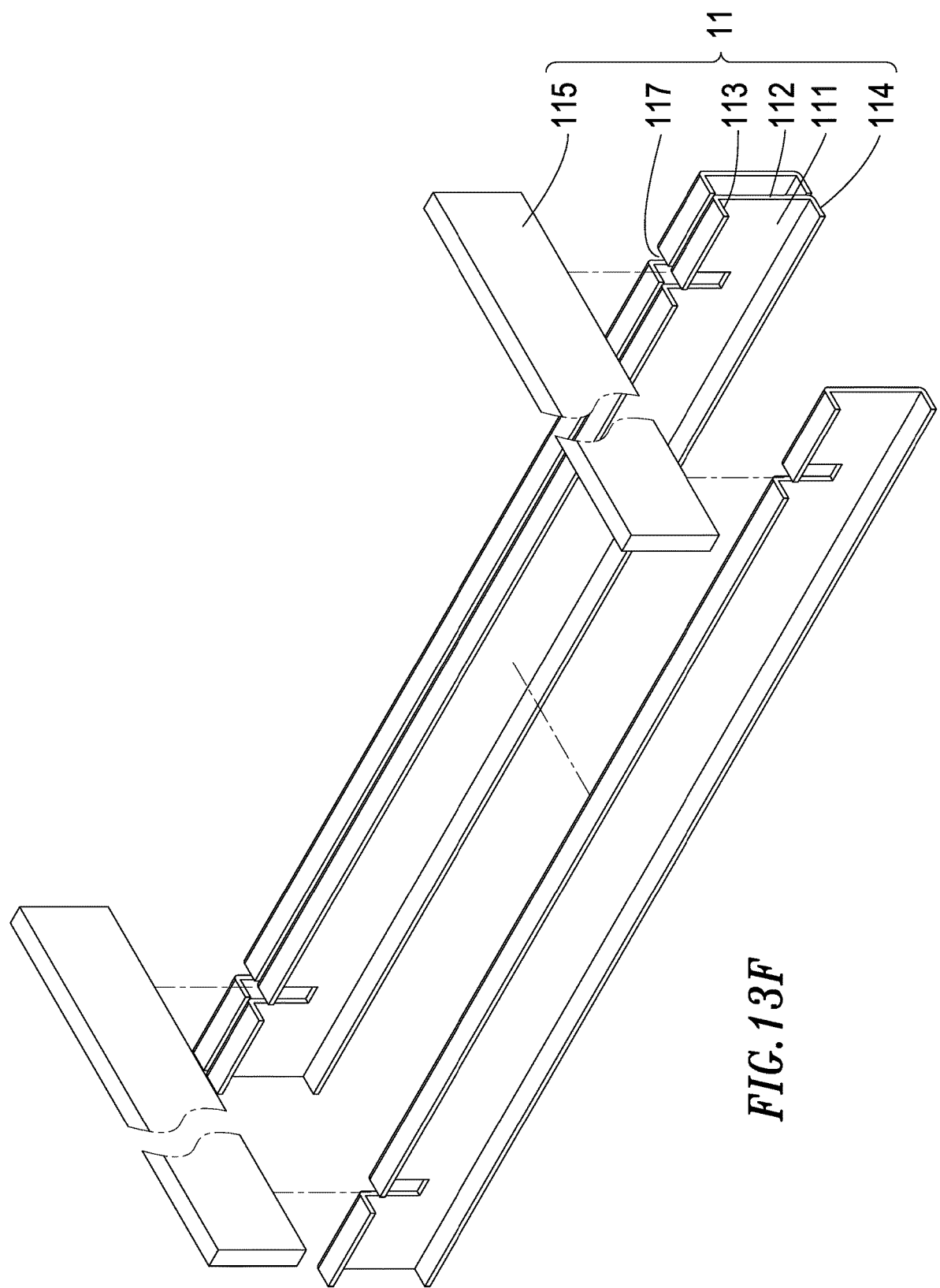
FIG. 13F shows a configuration stereo view for a sixth embodiment of the heat exchange component in the condenser according to the present invention.

Subsequently, refer to FIG. 13A, wherein a first embodiment for the heat exchange component 11 of the fast heat-sinking, current stabilization and pressure boosting device for condenser according to the present invention is shown. It can be seen that the fourth board surface 115 is formed by the two ends of the first board surface 112 extending toward the inner channel 111, and the extension length of the fourth board surface 115 is the same as that of the second board surface 113 and the third board surface 114, such that the fourth board surface 115 is completely blocked at the two ends of each of the inner channels 111. Refer next to FIG. 13B, wherein a second embodiment of the heat exchange component 11 is shown. It can be seen that the fourth board surface 115 is formed by the two ends of the first board surface 112 extending toward the upside of the inner channel 111, and the extension length of the fourth board surface 115 is the same as that of the second board surface 113 and the third board surface 114, such that the fourth board surface 115 is blocked simply at the upside of the two ends of each of the inner channels 111. Refer next to FIG. 13C, wherein a third embodiment of the heat exchange component 11 is shown. It can be seen that the fourth board surface 115 is formed by the two ends of the first board surface 112 extending toward the middle of the inner channel 111, and the extension length of the fourth board surface 115 is the same as that of the second board surface 113 and the third board surface 114, such that the fourth board surface 115 is blocked simply at the middle of the two ends of each of the inner channels 111. Further, refer to FIG. 13D, wherein a fourth embodiment of the heat exchange component 11 is shown. It can be seen that the fourth board surface 115 is formed by the two ends of the first board surface 112 extending toward the inner channel 111, and the extension length of the fourth board surface 115 is shorter than that of the second board surface 113 and the third board surface 114, such that the fourth board surface 115 is incompletely blocked at the two ends of each of the inner channels 111. Refer next to FIG. 13E, wherein a fifth embodiment of the heat exchange component 11 is shown. It can be seen that the fourth board surface 115 is formed by the two ends of the first board surface 112 extending toward the upside of the inner channel 111, while a protrusion section 116 is additionally formed by the downside of the two ends of the first board surface 112 extending outward, and the extension length of the fourth board surface 115 is the same as that of the second board surface 113 and the third board surface 114, such that the fourth board surface 115 is blocked simply at the upside of the two ends of each of the inner channels 111. Furthermore, refer next to FIG. 13F, wherein a sixth embodiment of the heat exchange component 11 is shown. A slot 117 is respectively configured at the upside the two ends of the first plate surface 112, the fourth board surface 115 is inserted into the slot 117, and the fourth board surface 115 is blocked simply at the upside of the two ends of the inner channel 111. It can be appreciated that the above-mentioned first embodiment is in a fully-blocked form, and the second to sixth embodiments are in a semi-blocked form, so users can selectively implement each of such heat exchange components 11 for appropriate combinations based on requirements. In manufacturing, it is not only that both ends of each inner channel 111 need to symmetrical, but also one end can be designed in a fully-blocked form while the other end in a semi-blocked form. Therefore, taking the first embodiment as an example, one end of each of the inner channels 111 close to the air in channel 14 and the water out channel 15 may be in a fully-blocked form, while the other end thereof remote from the air in channel 14 and the water out channel 15 can be in a fully-blocked or half-blocked form; in this way, it is possible to ensure that liquid water or gaseous water will not be lost when passing through the air in channel 14 and the water out channel 15 such that the liquid water or gaseous water can be massively retained in each of the inner channels 111 for heat exchange operations. In case that the heat exchange component 11 of the fully-blocked form is applied, then the heat-sinking module 1 must be provided with at least one channel 16 penetrating each of the heat exchange components 11; comparatively, suppose the heat exchange component 11 of the semi-blocked form is used, then the heat-sinking module 1 can be selectively configured with or without the channel 16.

Figure 15:
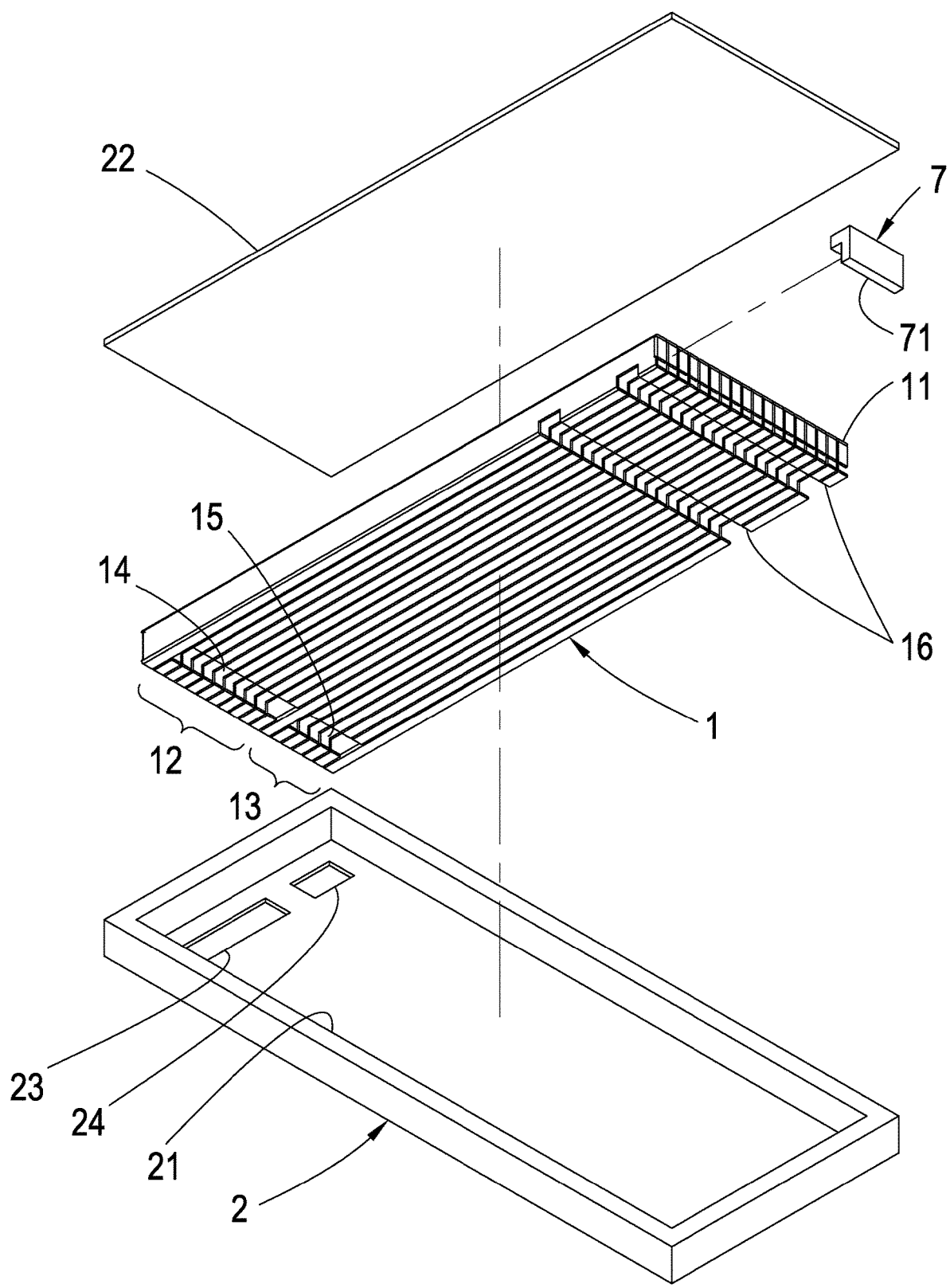
FIG. 15 shows a stereo disassembly view for the third embodiment of the condenser according to the present invention.
Figure 16:
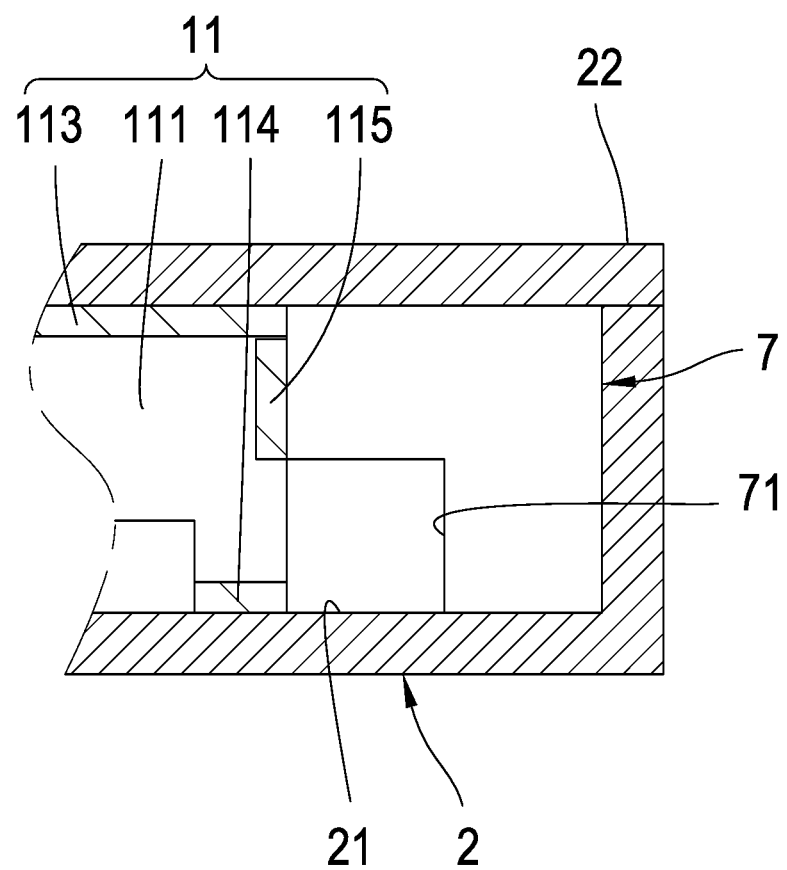
FIG. 16 shows a partial cross-sectioned view for the third embodiment of the condenser according to the present invention.

Then, refer to FIGS. 15 and 16, in which a third embodiment for the integral structure configuration of the current stabilization and pressure boosting device for evaporator according to the present invention is shown. In the present embodiment, a predetermined space is configured between one end of each of the heat exchange components 11 remote from the air in channel 14 and the water out channel 15 and the inner lateral surface of the chamber 21, and an impedance block 7 is also installed between one end of each of the heat exchange components 11 remote from the air in channel 14 and the water out channel 15 and the inner lateral surface of the chamber 21, such that the liquid water or gaseous water in each of the inner channels 111 is effectively blocked by the impedance block 7 and can not directly contact the chamber 21 and the outer lid 22 from each of the inner channels 111, thereby further eliminating overflow and leakage issues at the joint. Meanwhile, a large amount of liquid water or gaseous water is retained in each of the inner channels 111, and the gaseous water is stably cooled down and condensed to liquid water, especially blocked at the two ends of each of the inner channels 111, in order to rapidly increase the internal pressure to create a high pressure therein which then quickly forces the liquid water to be discharged from the water out channel 15. Besides, each of the heat exchange components 11 applies the half-blocked form as illustrated in the previous second to fifth embodiments (corresponding to FIGS. 13B, 13C, 13D, 13E and 13F, and herein the second embodiment is used in the Figure), and a notch 71 is openly provided on the impedance block 7 with respect to one end of each of the inner channels 111 in order to maintain a space for liquid water or gaseous water to flow through.

Figure 17:
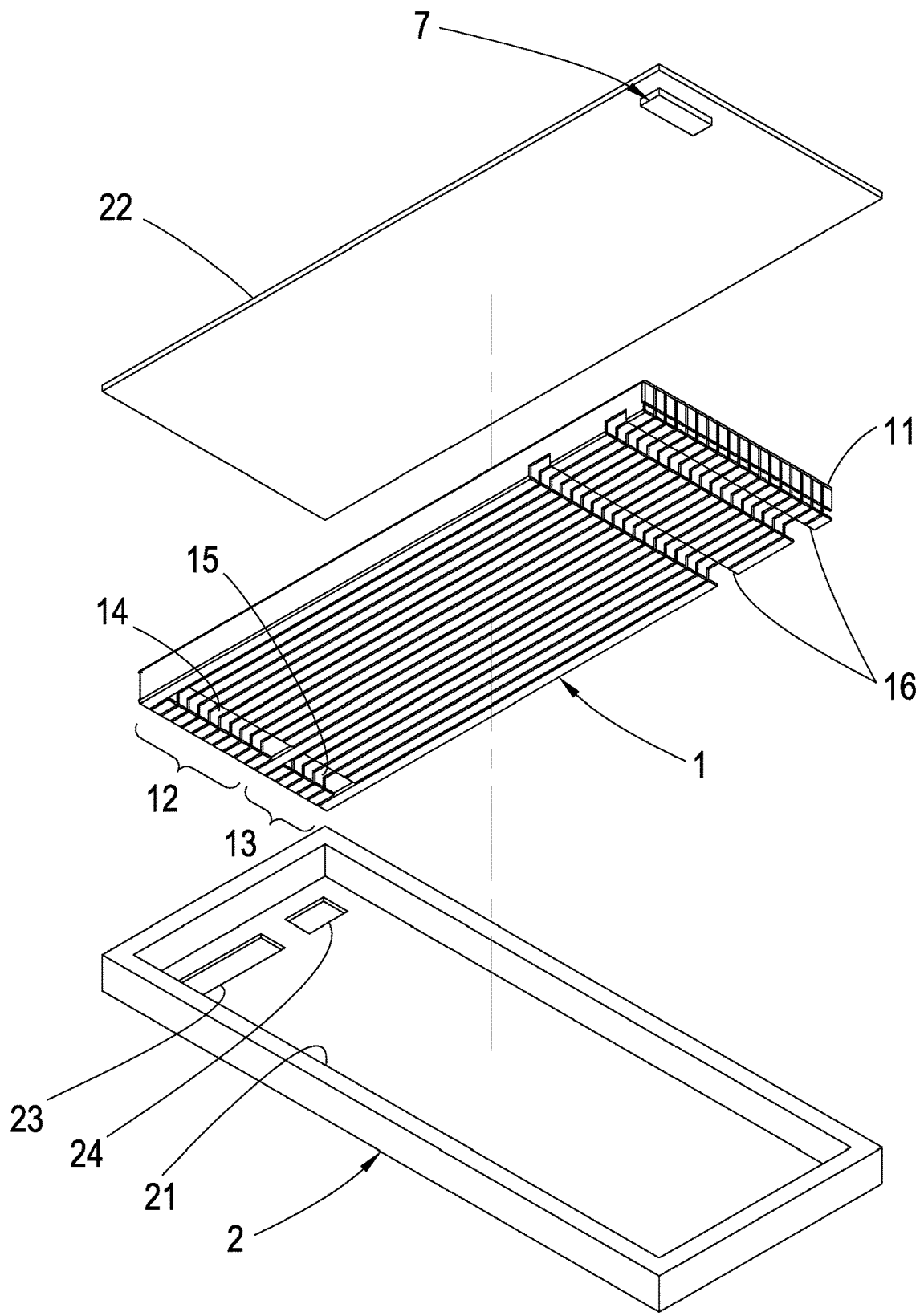
FIG. 17 shows a stereo disassembly view for the fourth embodiment of the condenser according to the present invention.

Further refer to FIG. 17, wherein a fourth embodiment for the integral structure configuration of the fast heat-sinking, current stabilization and pressure boosting device for condenser according to the present invention is shown, which exhibits an extension of the third embodiment. In the present embodiment, a predetermined space is configured between one end of each of the heat exchange components 11 remote from the air in channel 14 and the water out channel 15 and the inner lateral surface of the chamber 21, and each of the impedance blocks 7 is installed on one side of the outer lid 22 opposite to the chamber 21, so that, when the outer lid covers in fit on the upside of the outer case 2, each of the impedance blocks 7 can be placed between one end of the each of the heat exchange components 11 remote from the air in channel 14 and the water out channel 15 and the inner lateral surface of the chamber 21. In addition, each of the heat exchange components 11 applies the half-blocked form as illustrated in the aforementioned second to fifth embodiments (corresponding to FIGS. 13B, 13C, 13D, 13E and 13F, and herein the second embodiment is used in the Figure), and a notch 71 is openly provided on the impedance block 7 with respect to the two ends of each of the inner channels 111 in order to maintain a space for liquid water or gaseous water to flow through.

Figure 11:
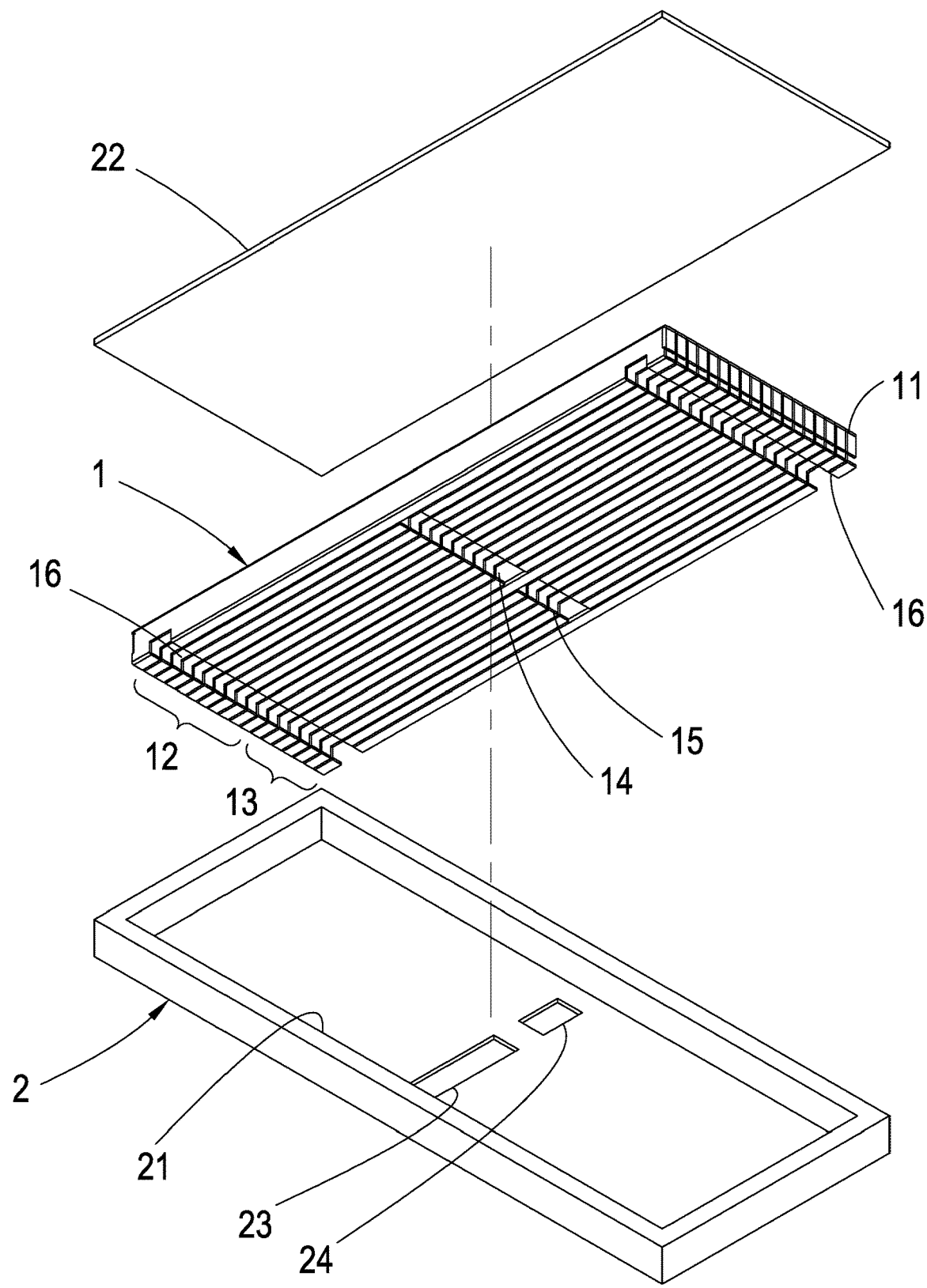
FIG. 11 shows a stereo disassembly view for the second embodiment of the condenser according to the present invention.
Figure 12:
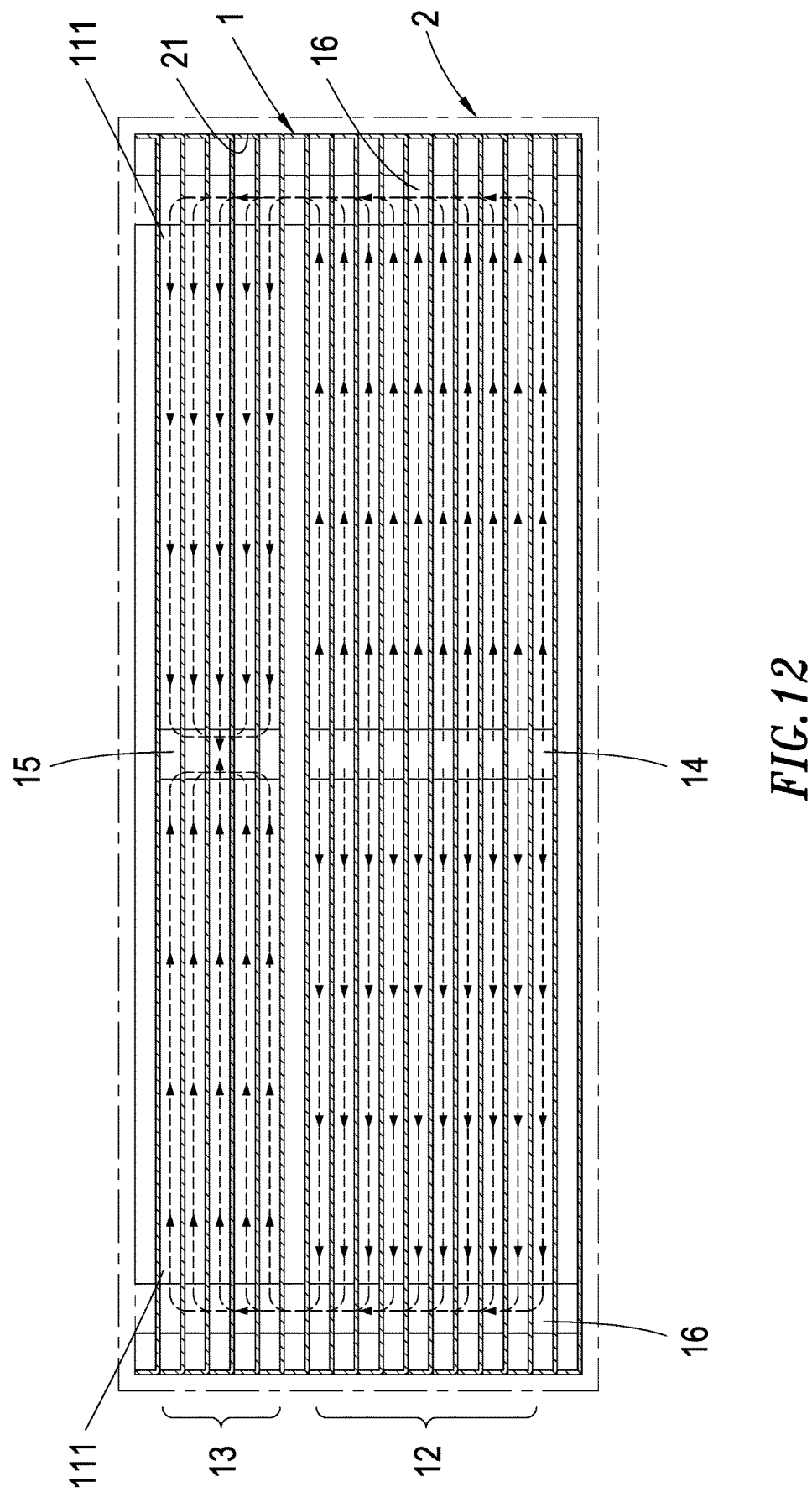
FIG. 12 shows an operational cross-sectioned view for the second embodiment of the condenser according to the present invention.

Refer to FIGS. 11 and 12, wherein the fifth board surface 115 at the two ends of each of the inner channels 111 in the second embodiment may be in the fully-blocked or semi-blocked form.

The previously disclosed embodiments are merely illustrative of some preferred ones of the present invention, which are not intended to limit the scope thereof; those who are skilled in the relevant technical fields can, after understanding the technical features and embodiments of the present invention as explained hereinabove, certainly make equivalent changes, alterations or modifications without departing from the spirit and scope of the present invention, which are nonetheless deemed as falling within the coverage of the present invention; accordingly, the scope of the present invention to be protected by patent laws is subject to the definition of the claims attached to this specification.

What is claimed is:

1. A fast heat-sinking, current stabilization and pressure boosting device for condenser, comprising:
    a heat exchange module, which is assembled by stacking a plurality of heat exchange components continuously, with each of the heat exchange components forming a plurality of inner channels arranged in parallel with each other, in which the heat exchange module is further divided into a high pressure area and a low pressure area, and the inner channels distributed in the high pressure area have a higher internal temperature, while the inner channels distributed in the low pressure area have a lower internal temperature; also, an ambient cold air source is provided beside the low pressure area, a gaseous water inlet is installed in the high pressure area, and an air in channel passes through each of the inner channels located in the high pressure area, and a water out channel is installed in the low pressure area, while the water out channel runs through each of the inner channels located in the low pressure area; in addition, the heat exchange module is configured with at least one channel that runs through each of the inner channels located in both the high pressure area and the low pressure area to allow the inner channels of the high pressure area and the low pressure area to mutually communicate;
    an outer case including a chamber for placing the heat exchange module, an outer lid to cover the chamber, and an air inlet and a water outlet, in which the air inlet is located correspondingly to a position of the air in channel, and the water outlet is located correspondingly to a position of the water out channel;
    thereby, the ambient cold air source lowers the temperature of the low pressure area in order to intensify an internal pressure difference between the low pressure area and the high pressure area, so that a gaseous water in the high pressure area is affected by the internal pressure difference to flow faster toward the low pressure area thereby improving use efficiency.

2. The fast heat-sinking, current stabilization and pressure boosting device for condenser according to claim 1, wherein the ambient cold air source provides naturally or unnaturally formed cold air.

3. The fast heat-sinking, current stabilization and pressure boosting device for condenser according to claim 1, wherein the ambient cold air source is a cold air generator mounted beside the low pressure area, and then directly blows a generated cold air toward the low pressure area.

4. The fast heat-sinking, current stabilization and pressure boosting device for condenser according to claim 1, wherein the low pressure area is located beside the ambient cold air source, and a cold air generator is installed beside the high pressure area such that the cold air generator generates and draws a cold air by suction of the cold air source.

5. The fast heat-sinking, current stabilization and pressure boosting device for condenser according to claim 1, wherein a predetermined space is configured between at least one end of each of the heat exchange components and an inner lateral surface of the chamber, and an impedance block is installed within the predetermined space to block a liquid water or a gaseous water in each of the inner channels from contacting a joint of the outer case and the lid to prevent leakage.

6. The fast heat-sinking, current stabilization and pressure boosting device for condenser according to claim 1, wherein each of the heat exchange components is composed of a first board surface, a second board surface and a third board surface integrally formed or fixed to each other; in addition, a fourth board surface is respectively installed on each of the heat exchange components with respect to two ends of the inner channel, and the fourth board surface is provided at the two ends of each of the inner channels for blocking a liquid water or a gaseous water in each inner channel from contacting a joint of the outer case and the lid to prevent leakage; in particular, the two ends of each of the inner channels close to the air in channel and the water out channel is blocked so that a plurality of liquid water or gaseous water is retained in each of the inner channels in order to stabilize an internal water flow.

7. The fast heat-sinking, current stabilization and pressure boosting device for condenser according to claim 6, wherein the fourth board surface is formed by two ends of the first board surface extending toward the inner channel, and an extension length of the fourth board surface is the same as an extension length of the second board surface and the third board surface, such that the fourth board surface is completely blocked at the two ends of each of the inner channels.

8. The fast heat-sinking, current stabilization and pressure boosting device for condenser according to claim 6, wherein the fourth board surface is formed by two ends of the first board surface extending toward the inner channel, and an extension length of the fourth board surface is the same as an extension length of the second board surface and the third board surface, such that the fourth board surface is completely blocked at the two ends of each of the inner channels.

9. The fast heat-sinking, current stabilization and pressure boosting device for condenser according to claim 6, wherein the fourth board surface is formed by two ends of the first board surface extending toward the inner channel, and an extension length of the fourth board surface is shorter than an extension length of the second board surface and the third board surface, such that the fourth board surface is not completely blocked at the two ends of each of the inner channels.

10. The fast heat-sinking, current stabilization and pressure boosting device for condenser according to claim 6, wherein a slot is respectively configured at two ends of the first board surface, and the fourth board surface is inserted into the slot.

\* \* \* \* \*